United States Patent
Cho

(10) Patent No.: US 7,773,435 B2
(45) Date of Patent: Aug. 10, 2010

(54) SEMICONDUCTOR MEMORY DEVICES FOR CONTROLLING LATENCY

(75) Inventor: Yong-ho Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 71 days.

(21) Appl. No.: 12/275,692

(22) Filed: Nov. 21, 2008

(65) Prior Publication Data

US 2009/0175092 A1    Jul. 9, 2009

(30) Foreign Application Priority Data

Jan. 3, 2008  (KR) .................. 10-2008-0000703

(51) Int. Cl.
*G11C 7/00* (2006.01)
*G11C 8/00* (2006.01)
*G11C 8/16* (2006.01)

(52) U.S. Cl. ............ 365/194; 365/233.1; 365/233.12; 365/233.17

(58) Field of Classification Search ........... 365/194
See application file for complete search history.

(56) References Cited

U.S. PATENT DOCUMENTS

| | | | | |
|---|---|---|---|---|
| 5,956,290 A * | 9/1999 | Matsuzaki | ........... | 365/233.1 |
| 6,643,215 B2 * | 11/2003 | Kwak | ........... | 365/233.17 |
| 6,738,295 B2 * | 5/2004 | Kim | ........... | 365/189.05 |
| 7,292,486 B2 * | 11/2007 | Lee | ........... | 365/194 |
| 7,420,871 B2 * | 9/2008 | Chu | ........... | 365/233.1 |
| 2002/0017939 A1 * | 2/2002 | Okuda et al. | ........... | 327/296 |
| 2006/0250861 A1 * | 11/2006 | Park et al. | ........... | 365/193 |
| 2008/0056019 A1 * | 3/2008 | Kim et al. | ........... | 365/189.05 |
| 2008/0192563 A1 * | 8/2008 | Cho | ........... | 365/233.17 |

FOREIGN PATENT DOCUMENTS

| | | |
|---|---|---|
| JP | 11-016437 | 1/1999 |
| JP | 2004-159239 | 6/2004 |
| KR | 102003004176 | 5/2003 |

* cited by examiner

*Primary Examiner*—Son L Mai
(74) *Attorney, Agent, or Firm*—Myers Bigel Sibley & Sajovec

(57) ABSTRACT

A semiconductor memory device includes a command buffer that receives an external command and outputs a first command signal, a clock buffer that receives an external clock signal and outputs a first internal clock signal, a delay measurement and initialization unit that receives the first internal clock signal and a fourth internal clock signal and responsively outputs a second internal clock signal and a plurality of delayed signals corresponding to a delay time between when the external clock signal is input and data is output, a delay locked loop that receives the second internal clock signal and outputs a third internal clock signal and the fourth internal clock signal, a latency signal generation unit that delays the first command signal by a delay time between when the second internal clock signal is input to the delay locked loop and when the third internal clock signal is output from the delay locked loop, and then outputs the delayed first command signal as a latency signal, in response to the second and third internal clock signals and the delayed signals, and a data output buffer that outputs the data in response to the latency signal and the third internal clock signal.

23 Claims, 12 Drawing Sheets

SEMICONDUCTOR MEMORY DEVICES FOR CONTROLLING LATENCY

CROSS-REFERENCE TO RELATED PATENT APPLICATIONS

This application claims the benefit of Korean Patent Application No. 10-2008-0000703, filed on Jan. 3, 2008, in the Korean Intellectual Property Office, the disclosure of which is incorporated herein in its entirety by reference.

BACKGROUND

1. Field of the Invention

The present invention relates to semiconductor devices, and more particularly, to semiconductor memory devices.

2. Description of the Related Art

In general, a semiconductor memory system has an external memory controller that requests data to be read from or written to a semiconductor memory device. If a read command is given, the memory controller expects valid data to be transmitted via a data bus at a predetermined external clock cycle, i.e., a predetermined latency, after the read command was given. The semiconductor memory device has a clock system that receives an external clock signal and generates a plurality of internal clock signals for internal operations of the semiconductor memory device from the external clock signal. An internal clock system that is well known in the field of semiconductor memory device, and particularly, in the field of dynamic random access memory (DRAM), is a back-timed read clock domain provided in a delay locked loop (hereinafter referred to as "DLL").

FIG. 1 is a block diagram illustrating a latency control operation of a conventional semiconductor memory device 100. Referring to FIG. 1, the semiconductor memory device 100 includes a command buffer 110, a clock buffer 120, a DLL 130, a latency counter 140, a replica delay unit 150 and a data output buffer 160.

The command buffer 110 receives an external command, e.g., a read command READ, and the clock buffer 120 receives an external clock signal EXCLK. Hereinafter, it is assumed that an external command is a read command READ. The DLL 130 receives the buffered external clock signal and generates an internal clock signal DLLCLK. The semiconductor memory device 100 controls a read latency in response to the read command READ. A read command PREAD output from the command buffer 110 is supplied to the latency counter 140. The latency counter 140 samples the read command PREAD and generates a latency signal LATENCY, in response to the read command PREAD, internal clock signal DLLCLK and a clock signal received from the replica delay unit 150.

The replica delay unit 150 may include a data output buffer replica unit 153 and a command path replica unit 157. The data output buffer replica unit 153 delays the internal clock signal DLLCLK by a delay time tSAC of the data output buffer 160, which is the time between when the internal clock signal DLLCLK enters the data output buffer 160 and data OUT is output from the data output buffer 160. Then the data output buffer replica unit 153 outputs the delayed internal clock signal to the command path replica unit 157. The command path replica unit 157 delays the delayed internal clock signal DLLCLK by a delay time tREAD of the command buffer 110, which is the time between when the read command READ enters the command buffer 110 and a command PREAD is output from the command buffer 110. Thus, the replica delay unit 150 delays the internal clock signal DLLCLK by tSAC+tREAD and then outputs the delayed internal clock signal. The replica delay unit 150 is constructed by a plurality of circuits replicating a tSAC path and a tREAD path. The DLL 130 delays the external clock signal EXCLK so that the internal clock signal DLLCLK can precede the external clock signal EXCLK by the delay tSAC.

The data output buffer 160 generates the output data OUT in response to the latency signal LATENCY and the internal clock signal DLLCLK.

FIG. 2A is a circuit diagram of the latency counter 140 and the replica delay unit 150 illustrated in FIG. 1. FIG. 2B is a timing diagram of signals illustrated in FIG. 2A. Referring to FIGS. 2A and 2B, the latency counter 140 is constructed in a shift register scheme including first through fifth flip-flops 210, 212, 214, 216, and 218. The total number of the first through fifth flip-flops 210 through 218 may vary according to a CAS latency (CL). The replica delay unit 150 includes first through fourth unit delay units 202, 204, 206, and 208. A total amount of time delayed by the first through fourth unit delay units 202 through 208 is tSAC+tREAD as described above. An amount of time tD delayed by each of the first through fourth unit delay units 202 through 208 is (tSAC+tREAD)/(CL−1).

The internal clock signal DLLCLK is input to the first unit delay unit 202 of the replica delay unit 150. The first through fourth unit delay units 202 through 208 are connected in series, and thus, the fourth unit delay unit 208 generates a clock signal P1 obtained by delaying the internal clock signal DLLCLK by tSAC+tREAD as illustrated in FIG. 2B. In the latency counter 140, the first through fifth flip-flops 210 through 218 receive the buffered read command PREAD and then generate a latency signal LATENCY, in response to clock signals P1, P2, P3, P4, and P5 being respectively received from the first through fourth unit delay units 202 through 208. The latency counter 140 samples the buffered read command PREAD in response to the clock signal P1 received from the fourth unit delay unit 208, and then generates the latency signal LATENCY by using the clock signal P5.

The latency counter 140 employing the shift register scheme is advantageous when there are a small number of types of CAS latency CL to be supported but may be disadvantageous in high-speed DRAM that supports a large number of types of CAS latency CL. This is because a delay chain, such as the latency counter 140, may be additionally needed according to the type of CAS latency CL. Thus, the more types of CAS latency CL there are, the greater the number of delay chains. Accordingly, delay tuning may be performed in consideration of changes in process, voltage and/or temperature, and further, layout area may be increased. Furthermore, so that a sufficient timing margin may be secured for each of the flip-flops 210 through 218, an increase in the types of CAS latency CL may result in an increase in a minimum amount of time for accessing a DRAM. As a result, data access speed limits in the DRAM may be determined by the latency counter 140 and not by the speed of reading data from a memory cell.

SUMMARY

A semiconductor memory device according to some embodiments includes a command buffer that receives an external command and outputs a first command signal, a clock buffer that receives an external clock signal and outputs a first internal clock signal, a delay measurement and initialization unit that receives the first internal clock signal and a fourth internal clock signal and responsively outputs a second internal clock signal and a plurality of delayed signals corresponding to a delay time between when the external clock signal is input and data is output, a delay locked loop that receives the second internal clock signal and outputs a third internal clock signal and the fourth internal clock signal, a latency signal generation unit that delays the first command signal by a delay time between when the second internal clock signal is input to the delay locked loop and when the third internal clock signal is output from the delay locked loop, and then outputs the delayed first command signal as a latency signal, in response to the second and third internal clock signals and the delayed signals, and a data output buffer that outputs the data in response to the latency signal and the third internal clock signal.

The latency signal generation unit may include a sampling unit that receives the first command signal and samples the first command signal in response to the second internal clock signal and the delayed signals, and a transmission unit that receives the sampled first command signal and outputs the sampled first command signal as the latency signal.

The sampling unit may include a first ring counter that outputs a plurality of sampling clock signals in response to the second internal clock signal, and a sampler that samples the first command signal in response to the sampling clock signals and the delayed signals.

The sampler may include a plurality of flip-flops, each of which receives the first command signal and outputs the sampled first command signal in response to the corresponding sampling clock signal, and a path selection unit that selects a path via which the respective sampled first command signals are to be output in response to the delayed signals.

The transmission unit may include a second ring counter that outputs a plurality of transmission clock signals in response to the third internal clock signal, and a transmitter that outputs the sampled first command signal as the latency signal in response to the transmission clock signals.

The second ring counter may include a transmission clock controller that determines whether the third internal clock signal is to be delayed, a first flip-flop that receives an input signal in response to an output signal of the transmission clock controller, second through nth flip-flops being connected in series. Each of the second through nth flip-flops receives the transmission clock signal from another of the flip-flops in response to the output signal of the transmission clock controller, where n is an integer. A transmission clock initialization unit outputs the input signal, in response to a ring counter reset signal indicating whether the second ring counter is reset, an inversion output signal of the first flip-flop, and an output signal of the nth flip-flop.

The transmission unit may be located near the data output buffer.

The latency signal generation unit may include a second delay unit that generates a second command signal from the first command signal in response to the delayed signals, a sampling unit that receives the second command signal and samples the second command signal in response to the second internal clock signal and the delayed signals, and a transmission unit that outputs the sampled first command signal as the latency signal in response to the third internal clock signal.

The delay measurement and initialization unit may include a delayed control signal generation unit that generates first and second delayed control signals in response to the first internal clock signal and a locking complete signal, a divider that generates a divided clock signal by dividing the fourth internal clock signal in response to the first delayed control signal, a control clock signal generation unit that generates a control clock signal in response to the second delayed control signal and the first internal clock signal, and a delayed signal generation unit generating the delayed signals and a measurement stop signal in response to the control clock signal and the divided clock signal.

The delay locked loop may include a phase detector that compares phases of the first internal clock signal with the fourth internal clock signal and outputs a comparison signal, a delay controller that generates a phase control signal in response to the comparison signal, a first delay unit that delays the second internal clock signal and generates the third internal clock signal in response to the phase control signal, a data output buffer replica unit that receives the third internal clock signal and delays it for a delay time of the data output buffer, and a clock buffer replica unit that delays an output of the data output buffer replica unit for a delay time of the clock buffer and then outputs the fourth internal clock signal.

The second delay unit may include a logic circuit unit that generates a plurality of switch signals from a combination of the delayed signals and latency information of the memory device, a plurality of flip-flops connected in series, where the external command signal is sequentially input to the flip-flops in response to the external clock signal, and a switch unit that selects a signal from among the external command signal and the output signals of the flip-flops and transmits the selected signal as the second command signal, in response to the switch signals.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
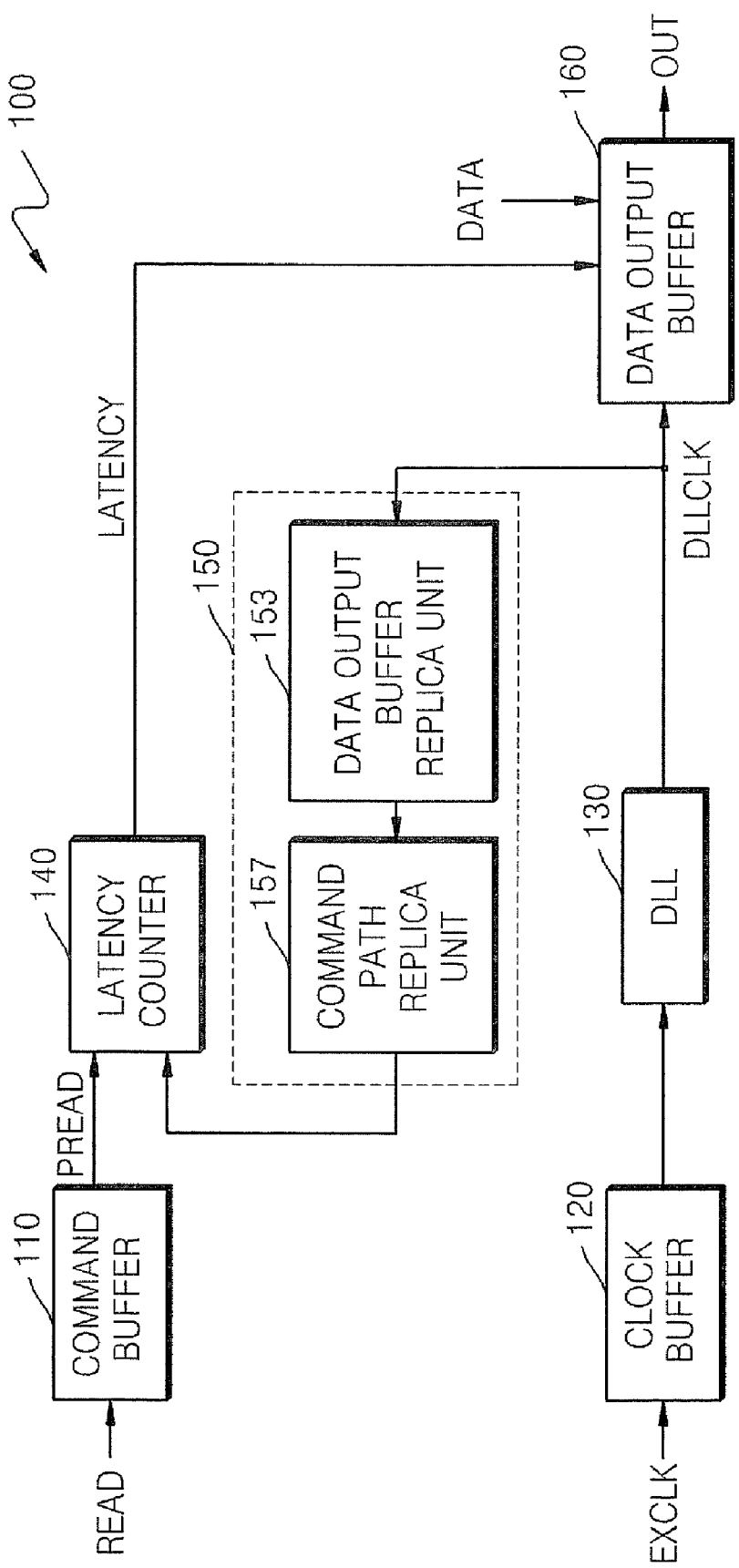
FIG. 1 is a block diagram illustrating a latency control operation of a conventional semiconductor memory device.
Figure 2A:
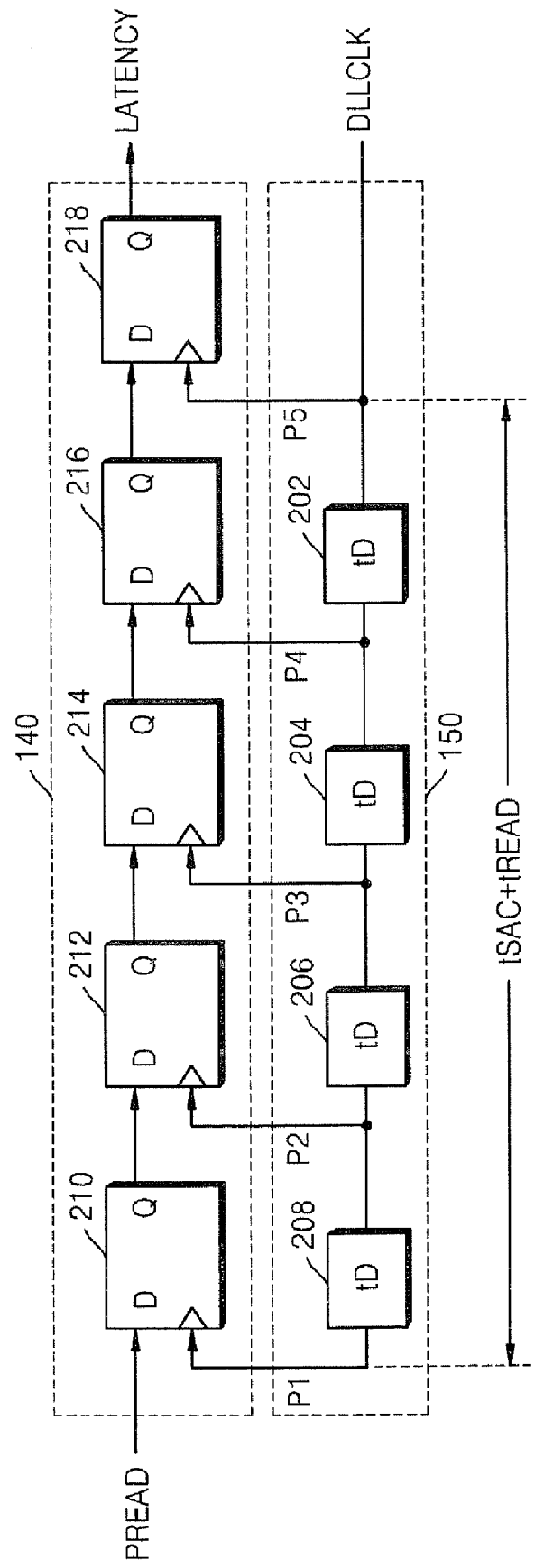
FIG. 2A is a circuit diagram of a latency counter and a replica delay unit illustrated in FIG. 1.
Figure 2B:
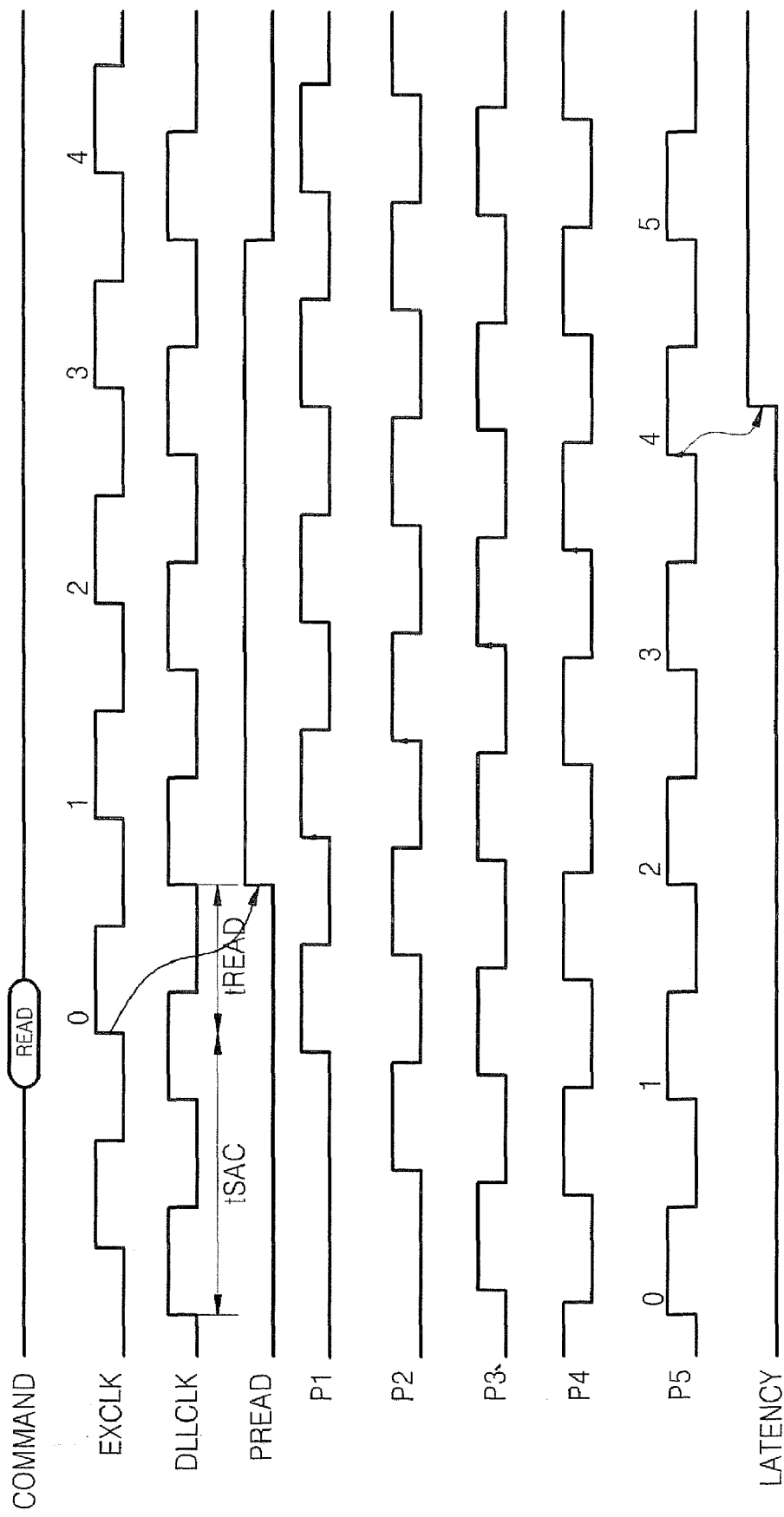
FIG. 2B is a timing diagram of signals illustrated in FIG. 2A.
Figure 3:
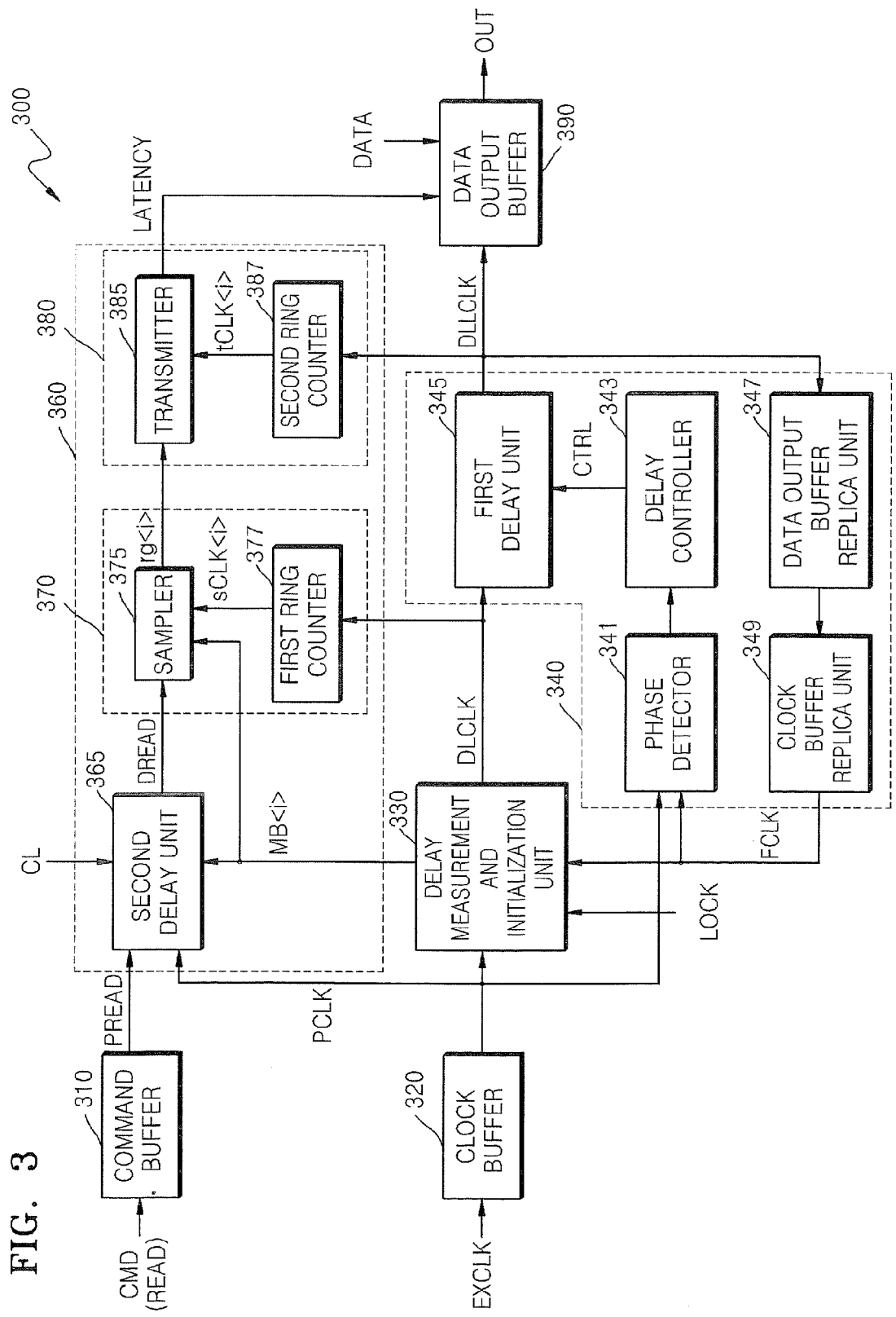
FIG. 3 is a block diagram of a semiconductor memory device according to some embodiments of the present invention.

FIG. 3 is a block diagram of a semiconductor memory device 300 according to some embodiments of the present invention. Referring to FIG. 3, the semiconductor memory device 300 may include a command buffer 310, a clock buffer 320, a delay measurement and initialization unit 330, a delay locked loop (DLL) 340, a latency signal generation unit 360, and a data output buffer 390.

The command buffer 310 receives an external command CMD and outputs a first command signal PREAD. It is assumed that the external command CMD is a read command READ. However, it would be apparent to those of ordinary skill in the art that the present invention is not limited to cases where the read command READ is given and can be applied to all cases where latency control is needed.

The clock buffer 320 receives an external clock signal EXCLK and outputs a first internal clock signal PCLK. The first internal clock signal PCLK is a signal delayed when the external clock signal EXCLK passes through the clock buffer 320, and the first command signal PREAD is a signal delayed when the external command READ passes through the command buffer 310. A delay between the external clock signal EXCLK and the first internal clock signal PCLK may be equal to the delay between the external command READ and the first command signal PREAD.

The delay measurement and initialization unit 330 outputs a plurality of delayed signals MB<i> and a second internal clock signal DLCLK, in response to the first internal clock signal PCLK, a fourth internal clock signal FCLK and a locking complete signal LOCK. Each of the delayed signals MB<i> corresponds to a delay time between when the external clock signal EXCLK is input to the clock buffer 320 and a data OUT is output from the data output buffer 390.

The DLL 340 receives the second internal clock signal DLCLK and outputs a third internal clock signal DLLCLK and the fourth internal clock signal FCLK. The DLL 340 may include a phase detector 341, a delay controller 343, a first delay unit 345, a data output buffer replica unit 347 and a clock buffer replica unit 349. The phase detector 341 compares the phases of the first internal clock signal PCLK and the fourth internal clock signal FCLK and then outputs a comparison signal. The delay controller 343 generates a phase control signal CTRL in response to the comparison signal. The first delay unit 345 generates the third internal clock signal DLLCLK by delaying the second internal clock signal DLCLK, in response to the phase control signal CTRL. The data output buffer replica unit 347 receives the third internal clock signal DLLCLK, delays it by a delay time of the data output buffer 390, which is the time for a signal to pass through the data output buffer 390, and then outputs the delayed signal. The clock buffer replica unit 349 receives the output of the data output buffer replica unit 347, delays it by a delay time of the clock buffer 320, and then outputs the fourth internal clock signal FCLK.

The latency signal generation unit 360 generates a latency signal LATENCY from the first command signal PREAD, in response to the second internal clock signal DLCLK, the third internal clock signal DLLCLK, and the delayed signals MB<i>. That is, the latency signal generation unit 360 delays the first command signal PREAD by the time between when the second internal clock signal DLCLK is input to the DLL 340 and the third internal clock signal DLLCLK is output from the DLL 340, and then outputs the delayed first command signal as a latency signal LATENCY.

The latency signal generation unit 360 may include a second delay unit 365, a sampling unit 370, and a transmission unit 380. The second delay unit 365 generates a second command signal DREAD from the first command signal PREAD, in response to the delayed signals MB<i> and a CAS latency CL. The second command signal DREAD may be a signal obtained by delaying the first command signal PREAD by n clock cycles, where n is an integer. That is, the second delay unit 365 delays the First command signal PREAD by an integral multiple of the clock cycle and then outputs the second command signal DREAD.

The sampling unit 370 receives the second command signal DREAD and samples the second command signal DREAD, in response to the second internal clock signal DLCLK and the delayed signals MB<i>. The sampling unit 370 may include a first ring counter 377 and a sampler 375. The first ring counter 377 outputs a plurality of sampling clock signals sCLK<i> in response to the second internal clock signal DLCLK. The sampler 375 samples the second command signal DREAD in response to the sampling clock signals sCLK<i>.

The transmission unit 380 outputs the sampled second command signal rg<i> as the latency signal LATENCY in response to the third internal clock signal DLLCLK. The transmission unit 380 may include a second ring counter 387 and a transmitter 385. The second ring counter 387 outputs a plurality of transmission clock signals tCLK<i> in response to the third internal clock signal DLLCLK. The transmitter 385 outputs the sampled second command signal rg<i> as the latency signal LATENCY in response to the transmission clock signals tCLK<i>.

The delay measurement and initialization unit 330 initializes the first ring counter 377 and the second ring counter 387 while the delayed signals MB<i> are generated. More specifically, the first ring counter 377 and the second ring counter 387 may be embodied as a plurality of flip-flops, and the delay measurement and initialization unit 330 initializes the flip-flops.

FIG. 3 illustrates a case where the latency signal generation unit 360 includes the second delay unit 365. However, the second delay unit 365 may be omitted. If the second delay unit 365 is omitted, the sampling unit 370 receives the first command signal PREAD and samples the first command signal PREAD in response to the second internal clock signal DLCLK and the delayed signals MB<i>, and the transmission unit 380 outputs the sampled first command signal rg<i> as the latency signal LATENCY in response to the third internal clock signal DLLCLK. If the second delay unit 365 is omitted, the sampling unit 370 may perform the operation of the second delay unit 365 by changing a path via which the sampled first command signal rg<i> is output. The result of setting a path by the sampling unit 370 will be described later in greater detail with reference to FIGS. 4 through 7.

The data output buffer 390 outputs data DATA in response to the latency signal LATENCY and the third internal clock signal DLLCLK.

Figure 4:
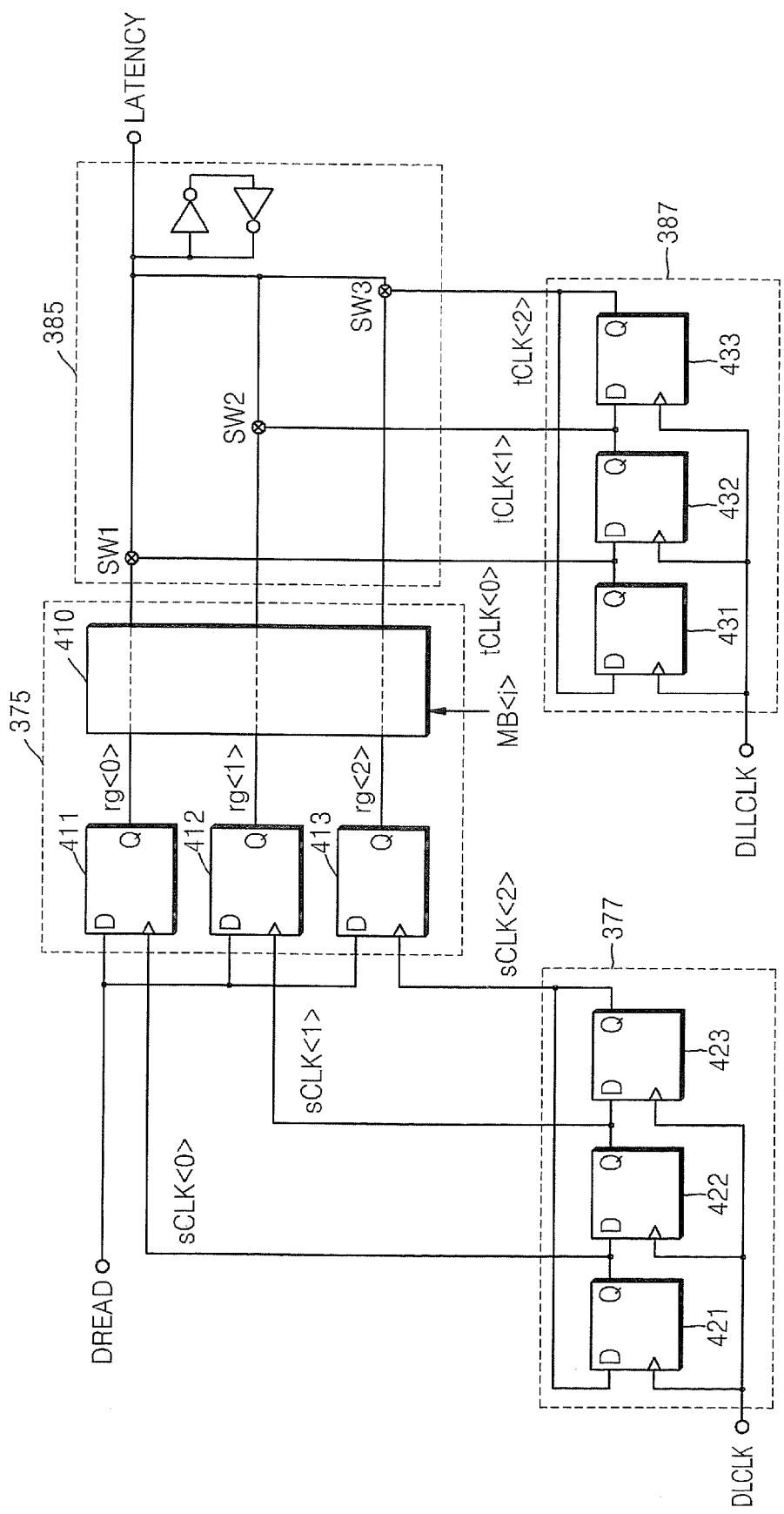
FIG. 4 is a circuit diagram of a sampling unit and a transmission unit illustrated in FIG. 3 according to some embodiments of the present invention.

FIG. 4 is a circuit diagram of the sampling unit 370 and the transmission unit 380 illustrated in FIG. 3 according to some embodiments of the present invention. Referring to FIGS. 3 and 4, the sampler 375 may include a plurality of flip-flops 411, 412, and 413 and a path selection unit 410. The flip-flops 411 through 413 receive a second command signal DREAD and then respectively output sampled second command signals rg<0>, rg<1> and rg<2> in response to corresponding sampling clock signals sCLK<0>, sCLK<1>, and sCLK<2>. The path selection unit 410 selects paths via which the respective, sampled second command signals rg<0>, rg<1>, and rg<2> are to be output, in response to delayed signals MB<i>. Referring to FIG. 4, the sampled second command signal rg<0> received from the first flip-flop 411 is output as a latency signal LATENCY from the transmitter 385 in response to a first transmission clock signal tCLK<0>. The sampled second command signal rg<1> received from the second flip-flop 412 is output as the latency signal LATENCY from the transmitter 385 in response to a second transmission clock signal tCLK<1>. The sampled second command signal rg<2> received from the third flip-flop 413 is output as the latency signal LATENCY from the transmitter 385 in response to a third transmission clock signal tCLK<2>.

The first ring counter 377 may include a plurality of flip-flops 421, 422, and 423 that respectively receive a sampling clock signal from the flip-flops 423, 421 and 422 connected to their input terminals and operate in response to the second internal clock signal DLCLK. That is, the fourth flip-flop 421 receives the third sampling clock signal sCLK<2> and outputs the first sampling clock signal sCLK<0> in response to a second internal clock signal DLCLK. The fifth flip-flop 422 receives the first sampling clock signal sCLK<0> and outputs the second sampling clock signal sCLK<1> in response to a second internal clock signal DLCLK. The sixth flip-flop 423 receives the second sampling clock signal sCLK<1> and outputs the third sampling clock signal sCLK<2> in response to a second internal clock signal DLCLK.

The transmitter 385 may include a plurality of switches SW1, SW2, and SW3 for respectively determining whether the sampled second command signals rg<0>, rg<1>, and rg<2> are output as the latency signal LATENCY, in response to the transmission clock signals tCLK<0>, tCLK<1>, and tCLK<2>.

The second ring counter 387 may include a plurality of flip-flops 431, 432, and 433 that respectively receive a transmission clock signal from the flip-flops 433, 431, and 432 connected to their input terminals and operate in response to a third internal clock signal DLLCLK. That is, the seventh flip-flop 431 receives the third transmission clock signal tCLK<2> and outputs the first transmission clock signal tCLK<0> in response to the third internal clock signal DLLCLK. The eighth flip-flop 432 receives the first transmission clock signal tCLK<0> and outputs the second transmission clock signal tCLK<1> in response to the third internal clock signal DLLCLK. The ninth flip-flop 433 receives the second transmission clock signal tCLK<1> and outputs the third transmission clock signal tCLK<2> in response to the third internal clock signal DLLCLK.

FIG. 4 illustrates a case where the second command signal DREAD is sampled in response to the three sampling clock signals sCLK<0>, sCLK<1>, sCLK<2> and the sampled second command signals rg<0>, rg<1>, and rg<2> are output as the latency signal LATENCY in response to the three transmission clock signals tCLK<0>, tCLK<1>, and tCLK<2>. However, it would be apparent to those of ordinary skill in the art that similar advantages can be derived by changing the total number of flip-flops included in the first ring counter 377 and the second ring counter 387 even if the total numbers of sampling clock signals and transmission clocks are different from those described above.

Figure 5:
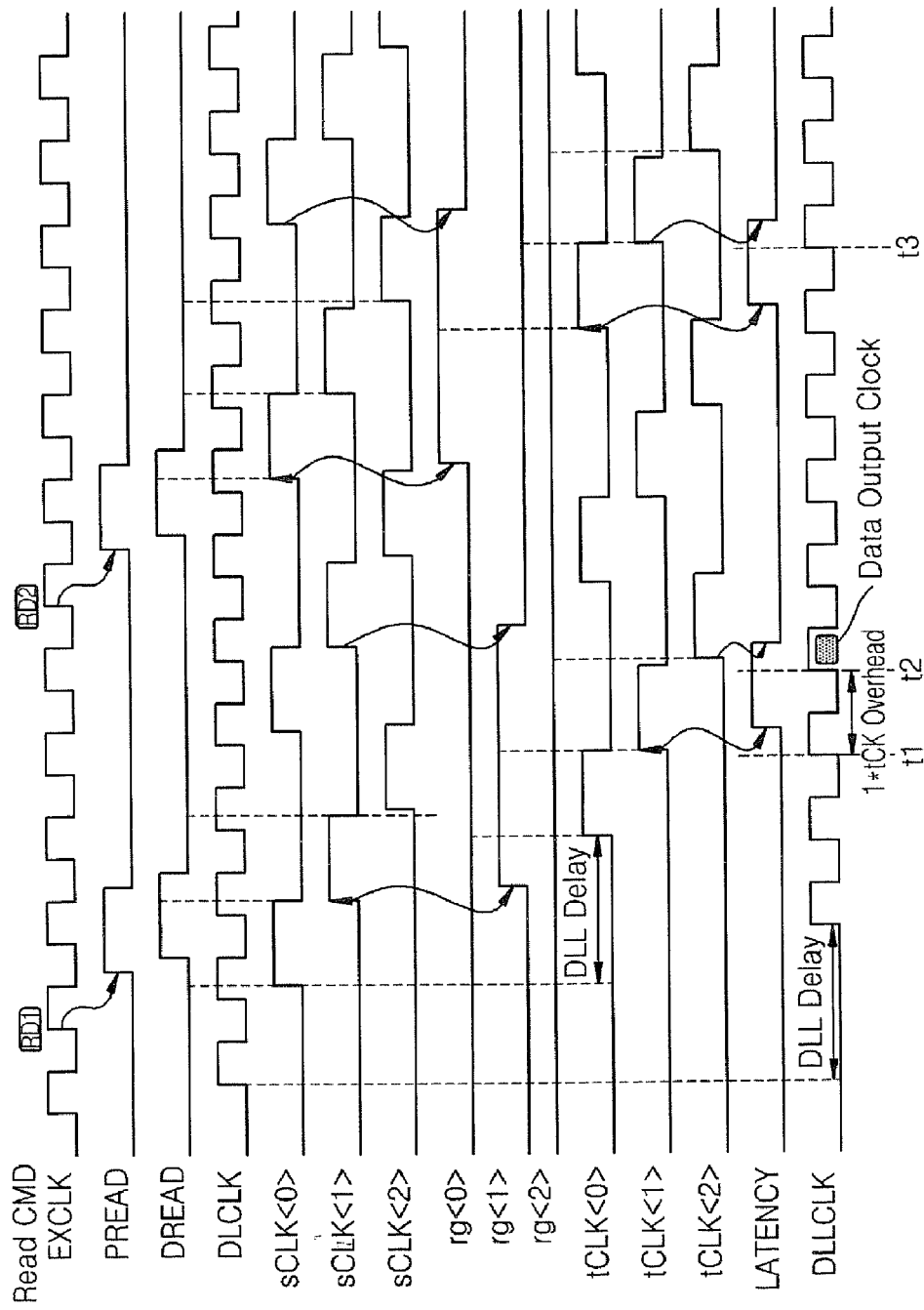
FIG. 5 is a timing diagram illustrating operation of the semiconductor memory device of FIG. 3 when a path selection unit selects a signal output path as illustrated in FIG. 4, according to some embodiments of the present invention.

FIG. 5 is a timing diagram illustrating the operation of the semiconductor memory device of FIG. 3 when the path selection unit 410 selects a signal output path as illustrated in FIG. 4, according to some embodiments of the present invention. Referring to FIGS. 3 through 5, the command buffer 310 receives an external command RD1 and outputs a first command signal PREAD. FIG. 5 illustrates a case where the second delay unit 365 does not operate normally. Therefore, referring to FIG. 5, a second command signal DREAD is delayed for a predetermined time, which is not an integral multiple of a clock cycle, while passing through the second delay unit 365. If the second delay unit 365 operates normally, the second command signal DREAD is delayed more than the first command signal PREAD, by an integral multiple of a clock cycle.

The delay measurement and initialization unit 330 outputs a second internal clock signal DLCLK, in response to a locking complete signal LOCK indicating that locking of the DLL 340 is completed, a first internal clock signal PCLK, and a fourth internal clock signal FCLK. The first ring counter 377 outputs first through third sampling clock signals sCLK<0>, sCLK<1>, and sCLK<2> in response to the second internal clock signal DLCLK. The second command signal DREAD is at a first logic state at rising edges of the first and third sampling clock signals sCLK<0> and sCLK<2>, and is at a second logic state at a rising edge of the second sampling clock signal sCLK<1>. Hereinafter, the first logic state means a logic low state and the second logic state means a logic high state. Thus, the second flip-flop 412 outputs a sampled second command signal rg<1> that is maintained at the second logic state from a rising edge of the second sampling clock signal sCLK<1> to a rising edge of a subsequent sampling clock signal, in response to the second sampling clock signal sCLK<1>. The first flip-flop 411 outputs a sampled second command signal rg<0> that is at the first logic state, in response to the first sampling clock signal sCLK<0>. The third flip-flop 413 outputs a sampled second command signal rg<2> that is at the first logic state, in response to the third sampling clock signal sCLK<2>.

The DLL 340 outputs a third clock signal DLLCLK obtained when a second clock signal DLCLK is delayed while passing through the first delay unit 345. The second ring counter 387 outputs first through third transmission clock signals tCLK<0>, tCLK<1>, and tCLK<2>. The switches SW1, SW2, and SW3 respectively output the sampled second command signals rg<0>, rg<1>, and rg<2> as a latency signal LATENCY when the corresponding transmission clock signals tCLK<0>, tCLK<1>, and tCLK<2> are at the second logic state.

While the switch SW1 is turned on due to the first transmission clock signal tCLK<0> being at the second logic state, the sampled second command signal rg<0> output from the first flip-flop 411 is at the first logic state and thus, the latency signal LATENCY is at the first logic state. However, while the switch SW2 is turned on due to the sampled second transmission clock signal tCLK<1> being at the second logic state, the sampled second command signal rg<1> output from the second flip-flop 412 is at the second logic state and thus, the latency signal LATENCY is at the second logic state. While the switch SW3 is turned on due to the third transmission clock signal tCLK<2> being at the second logic state, the sampled second command signal rg<2> output from the third flip-flop 413 is at the first logic state and thus, the latency signal LATENCY is at the first logic state. That is, the second logic state of the latency signal LATENCY is maintained from a rising edge of the second transmission clock signal tCLK<1> to a rising edge of the third transmission clock signal tCLK<2>.

The data output buffer 390 outputs data DATA in response to the third clock signal DLLCLK and the latency signal LATENCY. That is, referring to FIG. 5, the latency signal LATENCY is at the first logic state at a rising edge of the third clock signal DLLCLK at a point of time t1. The latency signal LATENCY is at the second logic state at a rising edge of the third clock signal DLLCLK at a point of time t2 a clock cycle after the point of time t1, and thus, the data output buffer 390 starts outputting the data DATA from the point of time t2.

A case where the command buffer 310 receives a new external command RD2 will now be described. In this case, the second command signal DREAD is at the second logic state at a rising edge of the first sampling clock signal sCLK<0>, and is at the first logic state at rising edges of the second and third sampling clock signals sCLK<1> and sCLK<2>. Thus, the first flip-flop 411 outputs the sampled second command signal rg<0> that is at the second logic state, in response to the first sampling clock signal sCLK<0>. The second flip-flop 412 outputs the sampled second command signal rg<1> that is at the first logic state, in response to the second sampling clock signal sCLK<1>. The third flip-flop 413 outputs the sampled second command signal rg<2> that is at the first logic state, in response to the third sampling clock signal sCLK<2>.

Thus, while the switch SW1 is turned on since the first transmission clock signal tCLK<0> is at the second logic state, the sampled second command signal rg<0> output from the first flip-flop 411 is at the second logic state and thus, the latency signal LATENCY is at the second logic state. However, while the switch SW2 is turned on due to the second transmission clock signal tCLK<1> being at the second logic state, the sampled second command signal rg<1> output from the second flip-flop 412 is at the first logic state, and thus, the latency signal LATENCY is at the first logic state. While the switch SW3 is turned on due to the third transmission clock signal tCLK<2> being at the second logic state, the sampled second command signal rg<2> output from the third flip-flop 413 is at the first logic state, and thus, the latency signal LATENCY is at the first logic state. That is, the second logic state of the latency signal LATENCY is maintained from a rising edge of the first transmission clock signal tCLK<0> to a rising edge of the second transmission clock signal tCLK<1>.

The data output buffer 390 outputs the data DATA in response to the third clock signal DLLCLK and the latency signal LATENCY and thus starts outputting the data DATA from a point of time t3, in response to the new external command RD2.

Figure 6:
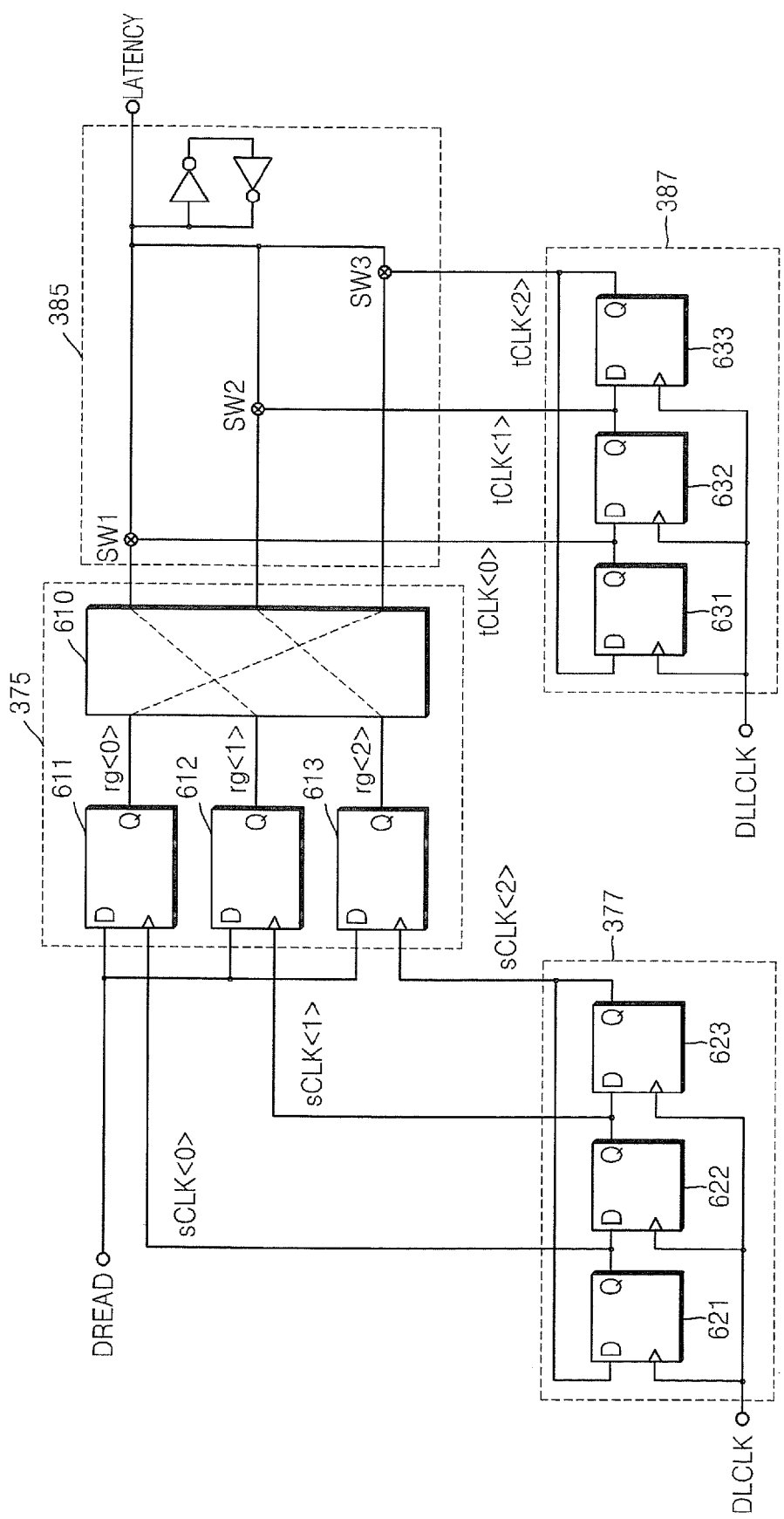
FIG. 6 is a circuit diagram of the sampling unit and the transmission unit illustrated in FIG. 3 according to further embodiments of the present invention.

FIG. 6 is a circuit diagram of the sampling unit 370 and the transmission unit 380 illustrated in FIG. 3 according to another embodiment of the present invention. Referring to FIGS. 3, 4 and 6, a first ring counter 377, a second ring counter 387, and a transmitter 385 illustrated in FIG. 6 respectively operate in the same manner as the first ring counter 377, the second ring counter 387, and the transmitter 385 illustrated in FIG. 4. However, a path selection unit 610 illustrated in FIG. 6 selects a signal output path different from that selected by the path selection unit 410 illustrated in FIG. 4. That is, FIG. 6 illustrates a case where a sampled second command signal rg<0> output from the first flip-flop 611 is output from the transmitter 385 as a latency signal LATENCY in response to a third transmission clock signal tCLK<2>. A sampled second command signal rg<1> output from the second flip-flop 612 is output from the transmitter 385 as the latency signal LATENCY in response to a first transmission clock signal tCLK<0>. A sampled second command signal rg<2> output from the third flip-flop 613 is output from the transmitter 385 as the latency signal LATENCY in response to a second transmission clock signal tCLK<1>.

Figure 7:
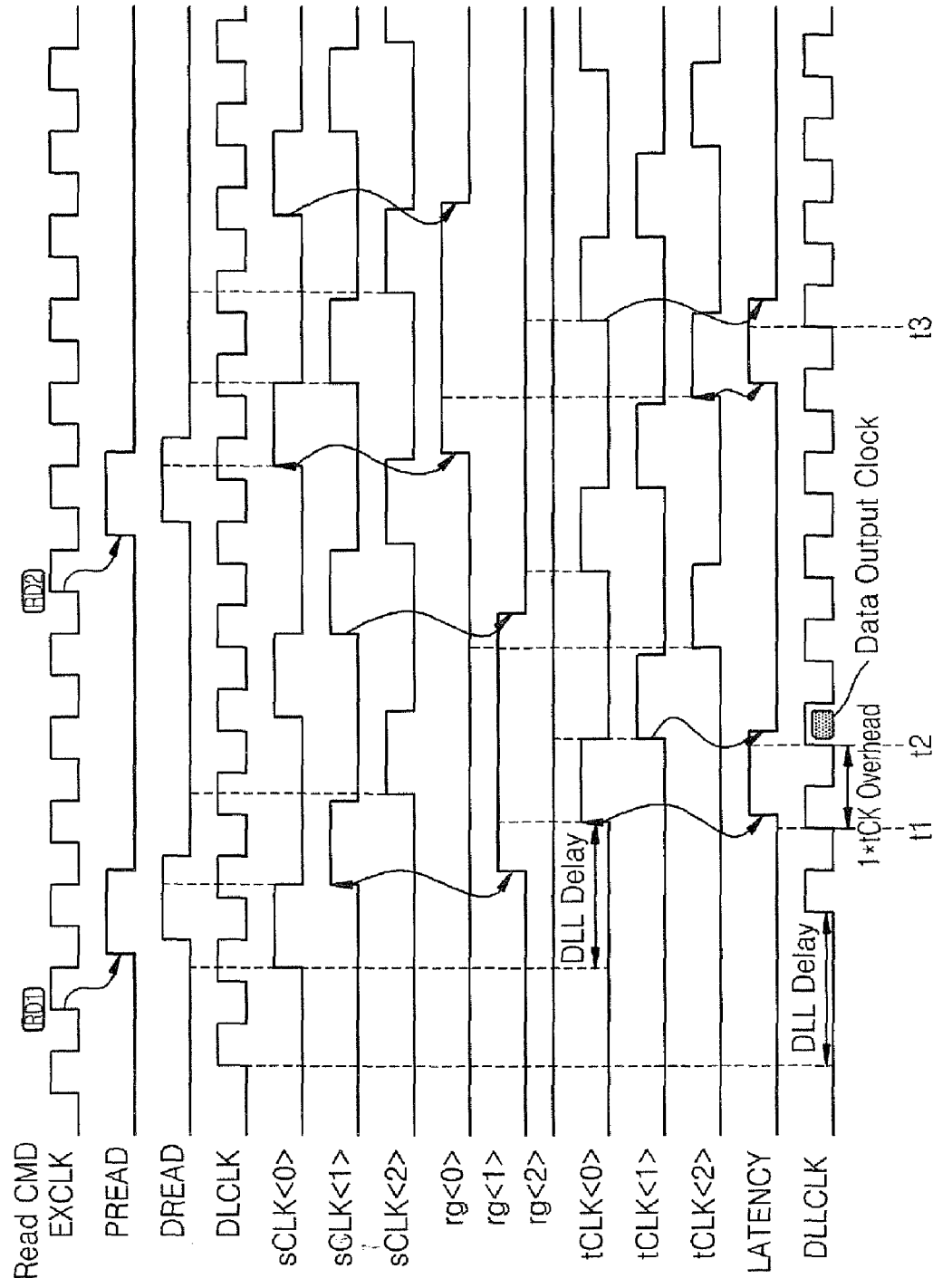
FIG. 7 a timing diagram illustrating the operation of the semiconductor memory device of FIG. 3 when a path selection unit selects a signal output path as illustrated in FIG. 6, according to some embodiment of the present invention.

FIG. 7 is a timing diagram illustrating operations of the semiconductor memory device 300 of FIG. 3 when the path selection unit 610 selects a signal output path as illustrated in FIG. 6, according to some embodiments of the present invention. Referring to FIGS. 3, 6 and 7, the command buffer 310 receives an external command RD1 and outputs a first command signal PREAD. As with FIG. 5, FIG. 7 illustrates a case where the second delay unit 365 does not delay the first command signal PREAD by an integral multiple of a clock cycle.

The first ring counter 377 outputs first through third sampling clock signals sCLK<0>, sCLK<1>, and sCLK<2> in response to a second internal clock signal DLCLK. A second command signal DREAD is at the first logic state at rising edges of the first and third sampling clock signals sCLK<0> and sCLK<2>, and is at the second logic state at a rising edge of the second sampling clock signal sCLK<1>. Accordingly, the second flip-flop 612 outputs a sampled second command signal rg<1> that is at the second logic state, in response to the second sampling clock signal sCLK<1> from a rising edge of the second sampling clock signal sCLK<1> to a rising edge of a subsequent sampling clock signal, as described above with respect to FIGS. 4 and 5. The first flip-flop 611 outputs a sampled second command signal rg<0> that is at the first logic state, in response to the first sampling clock signal sCLK<0>. The third flip-flop 613 outputs a sampled second command signal rg<2> that is at the first logic state, in response to the third sampling clock signal sCLK<2>.

The second ring counter 387 outputs first through third transmission clock signals tCLK<0>, tCLK<1>, and tCLK<2> in response to the third internal clock signal DLLCLK. The switches SW1, SW2, and SW3 respectively output the sampled second command signals rg<0>, rg<1>, and rg<2> as a latency signal LATENCY when the corresponding transmission clock signals tCLK<0>, tCLK<1>, and tCLK<2> are at the second logic state.

While the switch SW1 is turned on since the first transmission clock signal tCLK<0> is at the second logic state, the sampled second command signal rg<1> output from the second flip-flop 612 is at the second logic state, and thus, the latency signal LATENCY is at the second logic state. However, while the switch SW2 is turned on due to the second transmission clock signal tCLK<1> being at the second logic state, the sampled second command signal rg<2> output from the third flip-flop 613 is at the first logic state, and thus, the latency signal LATENCY is at the first logic state. While the switch SW3 is turned on due to the third transmission clock signal tCLK<2> being at the second logic state, the sampled second command signal rg<0> output from the first flip-flop 611 is at the second logic state, and thus, the latency signal LATENCY is at the second logic state. That is, the second logic state of the latency signal LATENCY is maintained from a rising edge of the first transmission clock signal tCLK<0> to a rising edge of the second transmission clock signal tCLK<1>.

The data output buffer 390 outputs data DATA in response to a third clock signal DLLCLK and the latency signal LATENCY. That is, referring to FIG. 7, the latency signal LATENCY is at the first-logic state at a rising edge of the third clock signal DLLCLK at a point of time t1. The latency signal LATENCY is at the second logic state at a rising edge of the third clock signal DLLCLK at a point of time t2 a clock cycle after the point of time t1, and thus, the data output buffer 390 starts outputting the data DATA from the point of time t2.

A case where the command buffer 310 receives a new external command RD2 will now be described. In this case, the second command signal DREAD is at the second logic state at a rising edge of the first sampling clock signal sCLK<0>, and is at the first logic state at rising edges of the second and third sampling clock signals sCLK<1> and sCLK<2>. Thus, the first flip-flop 611 outputs the sampled second command signal rg<0> that is at the second logic state, in response to the first sampling clock signal sCLK<0>. The second flip-flop 612 outputs the sampled second command signal rg<1> that is at the first logic state, in response to the second sampling clock signal sCLK<1>. The third flip-flop 613 outputs the sampled second command signal rg<2> that is at the first logic state, in response to the third sampling clock signal sCLK<2>.

Thus, while the switch SW1 is turned on since the first transmission clock signal tCLK<0> is at the second logic state, the sampled second command signal rg<1> output from the second flip-flop 612 is at the first logic state, and thus, the latency signal LATENCY is at the first logic state. While the switch SW2 is turned on due to the second transmission clock signal tCLK<1> being at the second logic state, the sampled second command signal rg<2> output from the third flip-flop 613 is at the first logic state, and thus, the latency signal LATENCY is at the first logic state. However, while the switch SW3 is turned on due to the third transmission clock signal tCLK<2> being at the second logic state, the sampled second command signal rg<0> output from the first flip-flop 611 is at the second logic state, and thus, the latency signal LATENCY is at the second logic state. That is, the second logic state of the latency signal LATENCY is maintained from a rising edge of the third transmission clock signal tCLK<2> to a rising edge of the first transmission clock signal tCLK<0>.

The data output buffer 390 outputs data DATA in response to the third clock signal DLLCLK and the latency signal LATENCY, and thus, starts outputting the data DATA from a point of time t3, in response to the new external command RD2.

Figure 8A:
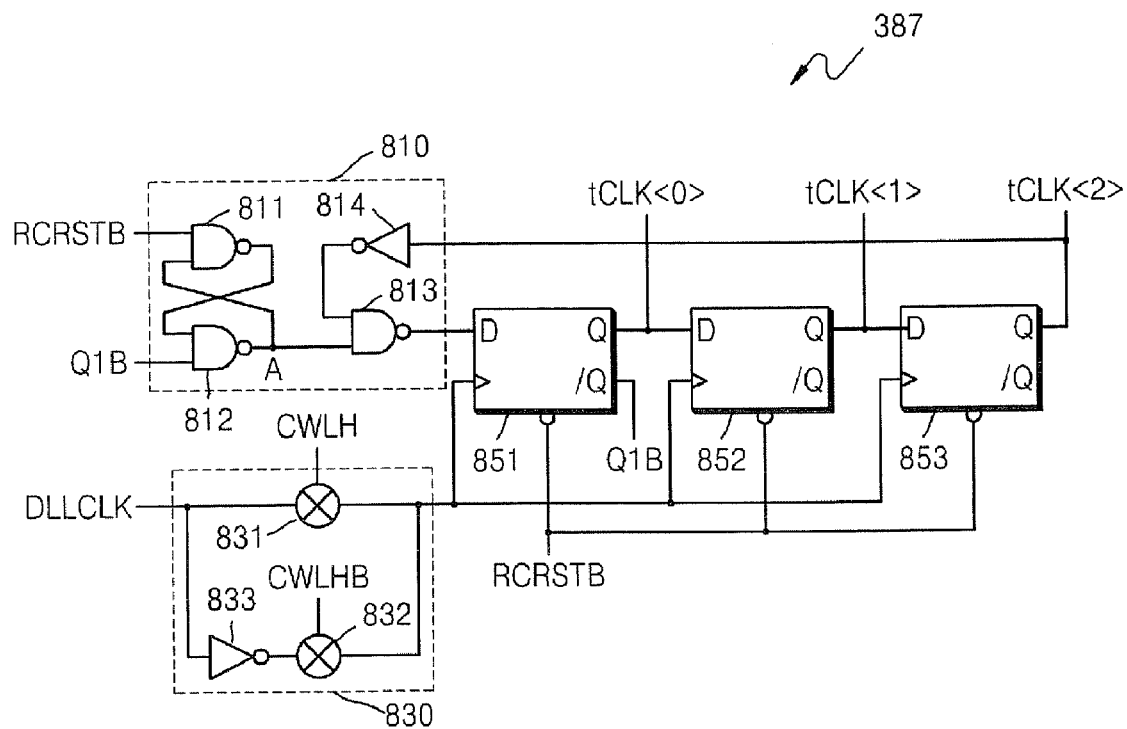
FIG. 8A is a circuit diagram of a second ring counter of FIG. 3 according to some embodiments of the present invention.
Figure 8B:
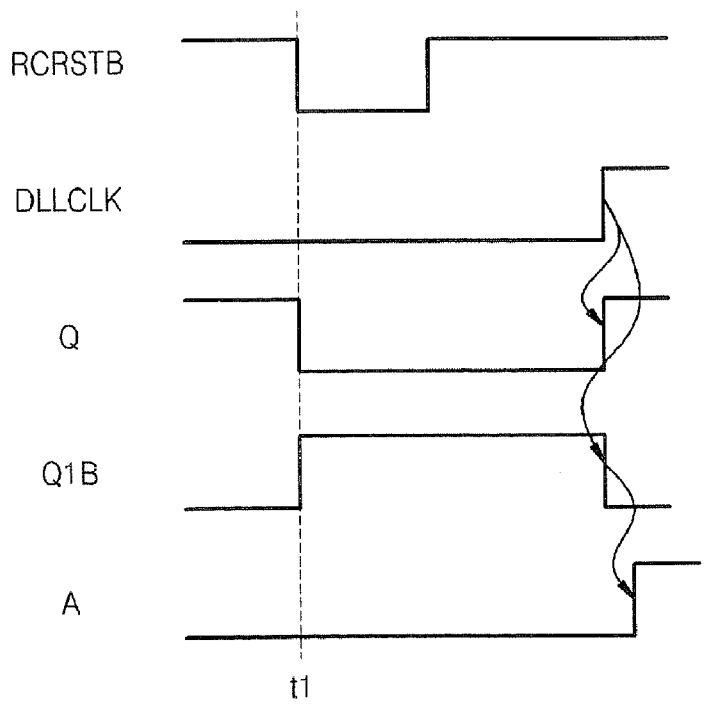
FIG. 8B is a timing diagram illustrating operation of a transmission clock initialization unit of FIG. 8A according to some embodiments of the present invention.

FIG. 8A is a circuit diagram of the second ring counter 387 illustrated in FIG. 3 according to some embodiments of the present invention. FIG. 8B is a timing diagram of the operation of a transmission clock initialization unit 810 illustrated in FIG. 8A according to some embodiments of the present invention. Referring to FIGS. 3 and 8A, the second ring counter 387 may include a transmission clock initialization unit 810, a transmission clock controller 830, and a plurality of flip-flops 851, 852, and 853. The transmission clock initialization unit 810 enables a first transmission clock signal tCLK<0> to be output after the flip-flops 851 through 853 are reset, in response to a ring counter reset signal RCRSTB and an inversion output signal Q1B of the flip-flop 851. The transmission clock initialization unit 810 may include a first NAND gate 811, a second NAND gate 812, a third NAND gate 813 and an inverter 814. The first NAND gate 811 receives the ring counter reset signal RCRSTB and an output signal received from the second NAND gate 812, and the second NAND gate 812 receives the inversion output signal Q1B of the flip-flop 851 and an output signal from the first NAND gate 811. The inverter 814 inverts a third sampling clock signal tCLK<2> and outputs the result of inverting, and the third NAND gate 813 receives output signals from second NAND gate 812 and the inverter 814 and outputs them to the flip-flop 851.

The operation of the transmission clock initialization unit 810 will now be described with reference to FIGS. 8A and 8B. Assuming that the flip-flops 851 through 853 perform a reset operation when the ring counter reset signal RCRSTB is at the first logic state, the reset operation is performed at a point of time t1. Thereafter, when a third internal clock signal DLLCLK transits from the first logic state to the second logic state, the inversion output signal Q1B of the flip-flop 851 transits from the second logic state to the first logic state. Accordingly, a node A transits from the first logic state to the second logic state, and thus, the flip-flop 851 receives a signal that is at the second logic state from the transmission clock initialization unit 810 and normally outputs the first transmission clock signal tCLK<0> after being reset.

The transmission clock controller 830 controls timing of the third internal clock signal DLLCLK that is to be supplied to the flip-flops 851 through 853. The transmission clock controller 830 may include a first switch 831, a second switch 832, and an inverter 833. That is, the transmission clock controller 830 turns on or off the first switch 831 or the second switch 832 so that the third internal clock signal DLLCLK can be directly output or can be inverted and output while passing through the inverter 833, in response to a first control signal CWLH or a second control signal CWLHB. Thus, the transmission clock controller 830 can either normally output the third internal clock signal DLLCLK, or delay it by half a clock cycle and then output the result of the delaying.

FIG. 8A illustrates embodiments of the second ring counter 387 of FIG. 3, and thus, it would be apparent to those of ordinary skill in the art that the present invention is not limited thereto.

Figure 9:
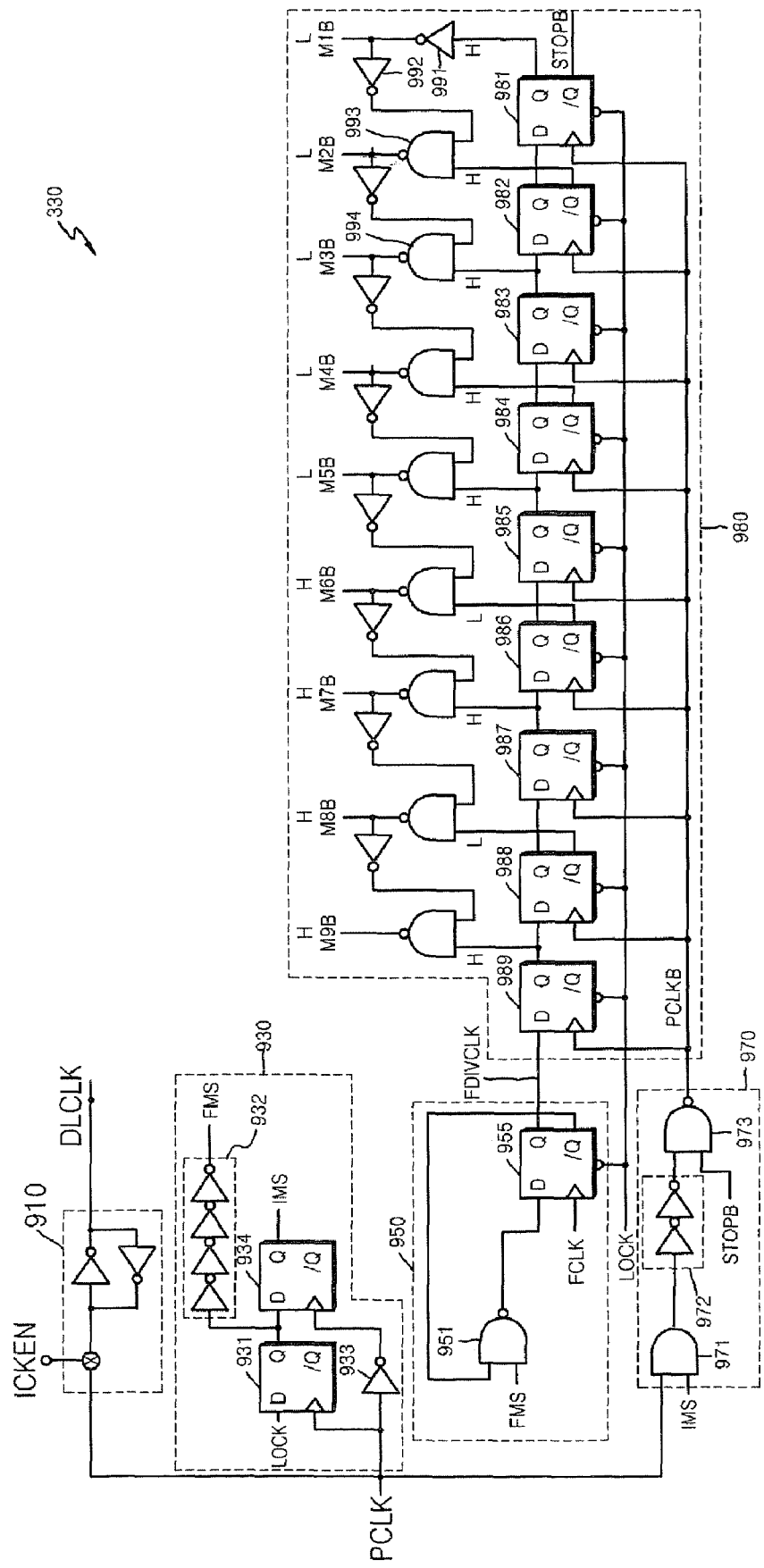
FIG. 9 is a circuit diagram of a delay measurement and initialization unit illustrated in FIG. 3 according to some embodiments of the present invention.
Figure 10:
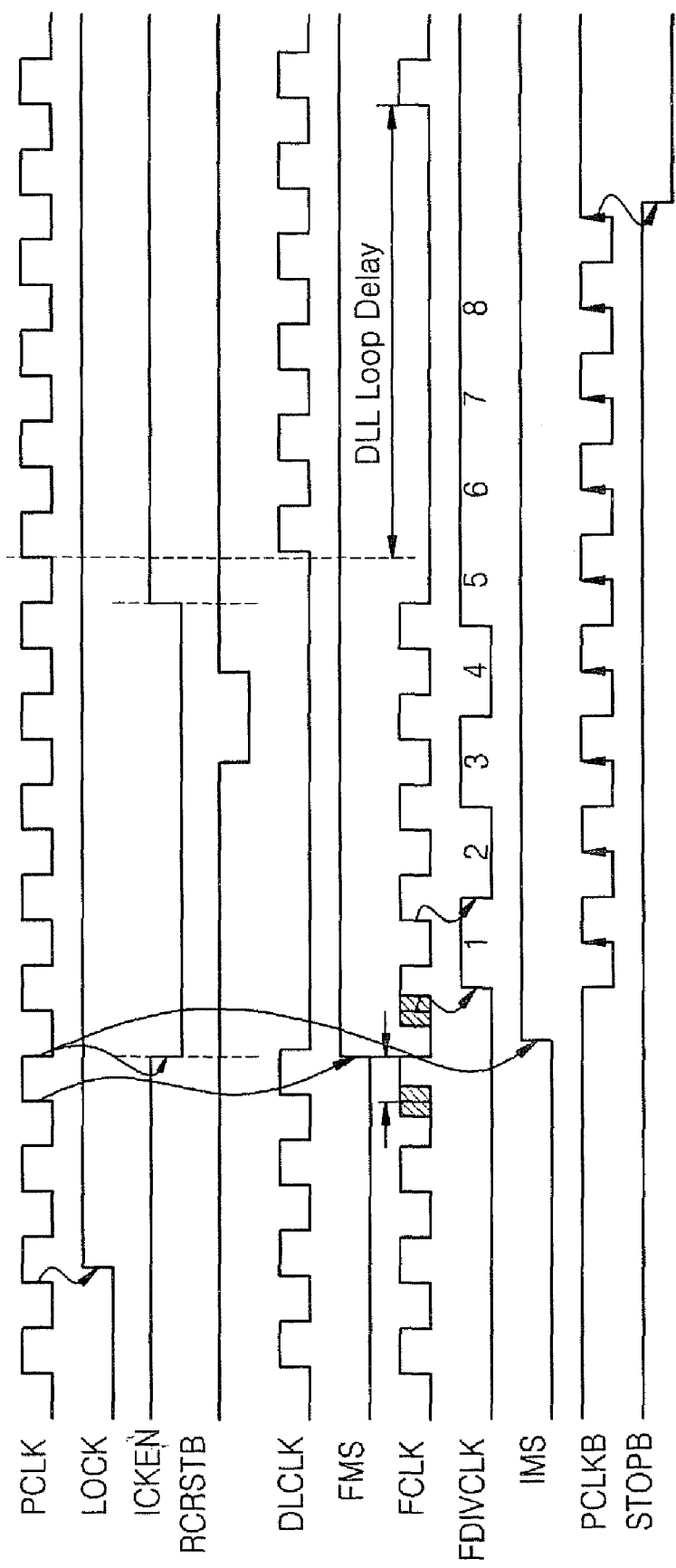
FIG. 10 is a timing diagram illustrating operation of the delay measurement and initialization unit illustrated in FIG. 3 according to some embodiments of the present invention.

FIG. 9 is a circuit diagram of the delay measurement and initialization unit 330 illustrated in FIG. 3, according to some embodiments of the present invention. FIG. 10 is a timing diagram of the operation of the delay measurement and initialization unit 330 according to some embodiments of the present invention. Referring to FIG. 9, the delay measurement and initialization unit 330 includes an initialization unit 910, a delayed control signal generation unit 930, a divider 950, a control clock signal generation unit 970, and a delayed signal generation unit 980. In the current embodiment, the delay measurement and initialization unit 330 can measure a delay in a maximum of nine clock cycles by using nine flip-flops 981, 982, 983, 984, 985, 986, 987, 988, and 989 included in the delayed signal generation unit 980.

The initialization unit 910 outputs a second internal clock signal DLCLK in response to a reset control signal ICKEN. That is, the initialization unit 910 includes a switch that is switched on or off in response to the reset control signal ICKEN and a latch circuit that latches a first internal clock signal PCLK and outputs a second internal clock signal DLCLK according to whether the switch is switched on or off.

The delayed control signal generation unit 930 includes a first flip-flop 931 that receives a locking complete signal LOCK in response to the first internal clock signal PCLK, a delayed control signal output unit 932 that receives an output of the first flip-flop 931 and outputs a first delayed control signal FMS, an inverter 933 that receives the first internal clock signal PCLK, and a second flip-flop 934 that receives the output of the first flip-flop 931 and outputs a second delayed control signal IMS in response to an output signal of the inverter 933.

The divider 950 includes an AND gate 951 that receives the first delayed control signal FMS and an inversion output signal /Q of a flip-flop 955, and the flip-flop 955 that is reset when the locking complete signal LOCK is deactivated, receives an output signal of the AND gate 951 and generates a divided clock signal FDIVCLK in response to a fourth internal clock signal FCLK.

The control clock signal generation unit 970 includes an AND gate 971 that receives the first internal clock signal PCLK and the second delayed control signal IMS, a delay unit 972 that receives an output signal of the AND gate 971 and delays it, and a NAND gate 973 that receives an output signal of the delay unit 972 and a measurement stop signal STOPB and generates a control clock signal PCLKB.

The delayed signal generation unit 980 includes the flip-flops 981 through 989 that receive the divided clock signal FDIVCLK in response to the control clock signal PCLKB and are connected in series. The flip-flops 981 through 989 are reset when the locking complete signal LOCK is deactivated. The flip-flop 989 receives and then outputs the divided clock signal FDIVCLK in response to the control clock signal PCLKB. The flip-flop 988 receives and then outputs an output of the flip-flop 989 preceding the flip-flop 988, in response to the control clock signal PCLKB. Similarly, the other flip-flops 987, 986, through 981 respectively receive and then output outputs of their preceding flip-flops, in response to the control clock signal PCLKB. An inversion output of the flip-flop 981 is generated as the measurement stop signal STOPB.

Also, the delayed signal generation unit 980 outputs a plurality of delayed signals M1B through M9B. The first delayed signal M1B is generated by a first inverter 991 that inverts the output of the flip-flop 981. The second delayed signal M2B is generated by a NAND gate 993 that receives an output of a second inverter 992 inverting the first delayed signal M1B, and an inversion output signal /Q of the flip-flop 982. Likewise, the fourth, sixth, and eighth delayed signals M4B, M6B, and M8B are respectively generated by NAND gates, i.e., by respectively performing a NAND operation on inversion signals of the third, fifth and seventh delayed signals M3B, M5B, and M7B, and inversion output signals /Q of the corresponding flip-flops 984, 986, and 988.

The third delayed signal M3B is generated by a NAND gate 994 that receives an inversion signal of the second delayed signal M2B and an output signal Q of the flip-flop 983. Likewise, the fifth, seventh and ninth delayed signals M5B, M7B, and M9B are respectively generated by other NAND gates, i.e., by respectively performing the NAND operation on the inversion signals of the fourth, sixth, and eighth delayed signals M4B, M6B, and M8B and output signals Q of the corresponding flip-flops 985, 987, and 989.

The operation of the delay measurement and initialization unit 330 will be described with reference to FIG. 10. Referring to FIGS. 3, 8A, 9 and 10, a locking complete signal LOCK indicating that locking of the DLL 340 is completed is generated at a rising edge of a first internal clock signal PCLK. The initialization unit 910 allows a second internal clock signal DLCLK to be maintained at the first logic state in predetermined sections, in response to a reset control signal ICKEN. A ring counter reset signal RCRSTB is enabled in the sections where the second internal clock signal DLCLK is maintained at the first logic state, thus resetting the first and second ring counters 377 and 387.

A first delayed control signal FMS that is at the second logic state is generated at a rising edge of the first internal clock signal PCLK, and a second delayed control signal IMS that is at the second logic state is generated at a falling edge of the first internal clock signal PCLK.

A control clock signal PCLKB whose logic level is opposite to the logic level of the first internal clock signal PCLK is generated when the second delayed control signal IMS is at the second logic state. A divided clock signal FDIVCLK is generated by dividing a third internal clock signal FCLK by two while the first delayed control signal FMS is at the second logic state. The output signals Q of the flip-flops 981 through 989 of the delayed signal generation unit 980 are generated having a logic state sequence H-H-H-H-H-L-H-L-H at rising edges of the control clock signal PCLKB. Thus, the first through ninth delayed signals M1B, M2B through M9B are generated having a logic sequence L-L-L-L-L-H-H-H-H. Here, 'L' denotes the first logic state and 'H' denotes the second logic state.

Figure 11:
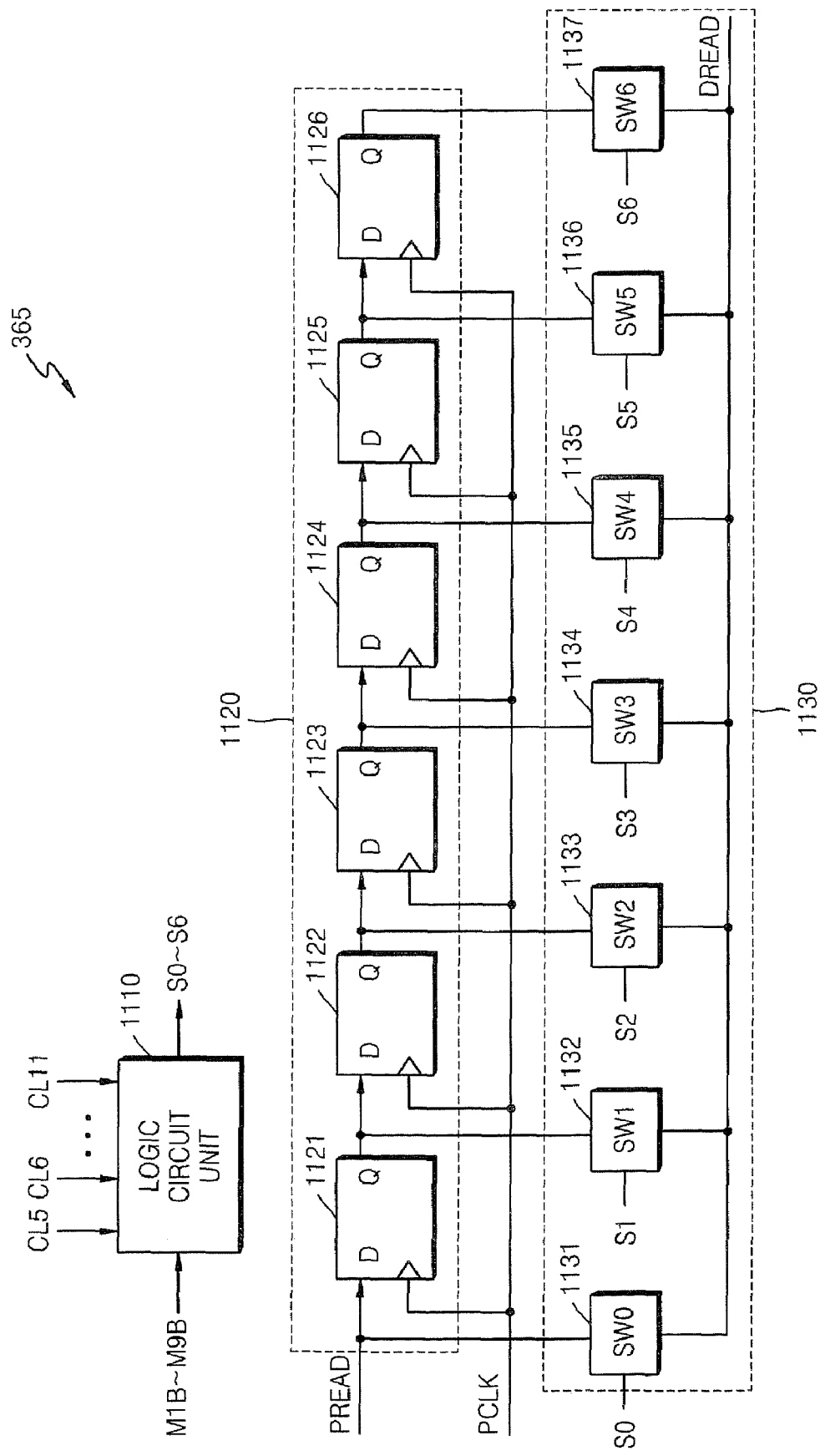
FIG. 11 is a circuit diagram of a second delay unit illustrated in FIG. 3 according to some embodiments of the present invention.

FIG. 11 is a circuit diagram of the second delay unit 365 of FIG. 3 according to some embodiments of the present invention. Referring to FIG. 11, the second delay unit 365 includes a logic circuit unit 1110 that generates a plurality of switch signals S0, through S6 from a combination of delayed signals M1B through M9B received from the delay measurement and initialization unit 330 illustrated in FIG. 3 and latency information CL5 through CL11. The second delay unit 365 further includes a shift register unit 1120 consisting of a plurality of flip-flops 1121 through 1126 to which a first command signal PREAD is sequentially supplied in response to a first internal clock signal PCLK, and a switch unit 130 that selectively outputs one of the first command signal PREAD and an output signals Q of the flip-flops 1121, through 1126 as a second command signal DREAD in response to the switch signals S0, through S6.

The present invention has been described above with respect to a semiconductor memory device that performs a read operation. However, as described above, the semiconductor memory device can be applied to various cases where latency control is needed. For example, the present invention can be applied to a dynamic on die termination (ODT) control circuit or a normal on die termination (ODT) control circuit. If the semiconductor memory device is employed in an ODT control circuit, it is possible to obtain a time margin by installing the transmission unit 380 illustrated in FIG. 3 near the data output buffer 390 illustrated in FIG. 3 of the semiconductor memory device.

According to the above embodiments of the present invention, a semiconductor memory device samples an external command by using an external clock signal and thus may not need a data output buffer replica unit and a command path replica unit unlike in a conventional semiconductor memory device. Accordingly, it may be possible to save time in a power down mode of the semiconductor memory device.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A semiconductor memory device comprising:
   a command buffer configured to receive an external command and to output a first command signal;
   a clock buffer configured to receive an external clock signal and to output a first internal clock signal;
   a delay measurement and initialization unit configured to receive the first internal clock signal and a fourth internal clock signal and to output a second internal clock signal and a plurality of delayed signals corresponding to a delay time between when the external clock signal is input and data is output;
   a delay locked loop configured to receive the second internal clock signal and to output a third internal clock signal and the fourth internal clock signal;
   a latency signal generation unit configured to delay the first command signal by a delay time between when the second internal clock signal is input to the delay locked loop and when the third internal clock signal is output from the delay locked loop, and to output the delayed first command signal as a latency signal, in response to the second and third internal clock signals and the delayed signals; and
   a data output buffer configured to output the data in response to the latency signal and the third internal clock signal.

2. The semiconductor memory device of claim 1, wherein the latency signal generation unit comprises:
   a sampling unit configured to receive the first command signal and to sample the first command signal in response to the second internal clock signal and the delayed signals; and
   a transmission unit configured to receive the sampled first command signal and to output the sampled first command signal as the latency signal.

3. The semiconductor memory device of claim 2, wherein the sampling unit comprises:
   a first ring counter configured to output a plurality of sampling clock signals in response to the second internal clock signal; and
   a sampler configured to sample the first command signal in response to the sampling clock signals and the delayed signals.

4. The semiconductor memory device of claim 3, wherein the delay measurement and initialization unit is configured to initialize the first ring counter during generation of the delayed signals.

5. The semiconductor memory device of claim 3, wherein the sampler comprises:
   a plurality of flip-flops, each configured to receive the first command signal and to output the sampled first command signal in response to one of the corresponding sampling clock signals; and
   a path selection unit configured to select a path via which the respective sampled first command signals are to be output in response to the delayed signals.

6. The semiconductor memory device of claim 3, wherein the first ring counter comprises a plurality of flip-flops connected in series, each of the flip-flops being configured to receive the sampling clock signal from another of the flip-flops in response to the second internal clock signal.

7. The semiconductor memory device of claim 2, wherein the transmission unit comprises:
   a second ring counter configured to output a plurality of transmission clock signals in response to the third internal clock signal; and
   a transmitter configured to output the sampled first command signal as the latency signal in response to the transmission clock signals.

8. The semiconductor memory device of claim 7, wherein the delay measurement and initialization unit is configured to initialize the second ring counter during generation of the delayed signals.

9. The semiconductor memory device of claim 7, wherein the transmitter comprises a plurality of switches, each configured to determine whether the sampled first command signal is to be output as the latency signal in response to the corresponding transmission clock signal.

10. The semiconductor memory device of claim 7, wherein the second ring counter comprises a plurality of flip-flops which are connected in series, where each of the flip-flops is configured to receive the sampling clock signal from another of the flip-flops in response to the third internal clock signal.

11. The semiconductor memory device of claim 7, wherein the second ring counter comprises:
    a transmission clock controller configured to determine whether the third internal clock signal is to be delayed;
    a first flip-flop configured to receive an input signal in response to an output signal of the transmission clock controller;
    second through $n^{th}$ flip-flops being connected in series, each of the second through $n^{th}$ flip-flops configured to receive the transmission clock signal from the preceding flip-flop in response to the output signal of the transmission clock controller, where n is an integer; and
    a transmission clock initialization unit configured to output the input signal, in response to a ring counter reset signal indicating whether the second ring counter is reset, an inversion output signal of the first flip-flop, and an output signal of the $n^{th}$ flip-flop.

12. The semiconductor memory device of claim 11, wherein the transmission clock controller comprises:
    a first switch configured to determine whether the third internal clock signal is to be transmitted in response to a first control signal;
    an inverter configured to invert the third internal clock signal and outputting the inverted third internal clock signal; and
    a second switch configured to determine whether an output signal of the inverter is to be transmitted in response to a second control signal.

13. The semiconductor memory device of claim 11, wherein the transmission clock initialization unit comprises:
    a first NAND gate configured to receive the ring counter reset signal and an output signal of a second NAND gate;
    the second NAND gate configured to receive the inversion output signal of the first flip-flop and an output signal of the first NAND gate;

an inverter configured to invert the output signal of the $n^{th}$ flip-flop; and a third NAND gate configured to receive an output signal of the second NAND gate and an output signal of the inverter.

14. The semiconductor memory device of claim 2, wherein the transmission unit is located near the data output buffer.

15. The semiconductor memory device of claim 1, wherein the latency signal generation unit comprises:
   a second delay unit configured to generate a second command signal from the first command signal in response to the delayed signals;
   a sampling unit configured to receive the second command signal and sampling the second command signal in response to the second internal clock signal and the delayed signals; and
   a transmission unit configured to output the sampled first command signal as the latency signal in response to the third internal clock signal.

16. The semiconductor memory device of claim 15, wherein the second delay unit is configured to output the second command signal obtained by delaying the first command signal by n clock cycles in response to the delayed signals, where n is an integer.

17. The semiconductor memory device of claim 1, wherein the delay measurement and initialization unit comprises:
   a delayed control signal generation unit configured to generate first and second delayed control signals in response to the first internal clock signal and a locking complete signal;
   a divider configured to generate a divided clock signal by dividing the fourth internal clock signal in response to the first delayed control signal;
   a control clock signal generation unit configured to generate a control clock signal in response to the second delayed control signal and the first internal clock signal; and
   a delayed signal generation unit configured to generate the delayed signals and a measurement stop signal in response to the control clock signal and the divided clock signal.

18. The semiconductor memory device of claim 17, wherein the delayed control signal generation unit comprises:
   a first flip-flop configured to receive the locking complete signal in response to the first internal clock signal;
   a delayed control signal output unit configured to receive an output of the first flip-flop and outputting the first delayed control signal;
   a first inverter configured to receive the first internal clock signal; and
   a second flip-flop configured to receive the output of the first flip-flop and outputting the second delayed control signal in response to the output of the first flip-flop.

19. The semiconductor memory device of claim 17, wherein the divider comprises:
   an AND gate configured to receive the first delayed control signal and an inversion output signal of a flip-flop; and
   the flip-flop configured to reset when the locking complete signal is deactivated, to receive an output of the AND gate in response to the fourth internal clock signal, and to generate the divided clock signal.

20. The semiconductor memory device of claim 17, wherein the control clock signal generation unit comprises:
   an AND gate configured to receive the first internal clock signal and the second delayed control signal;
   a delay unit configured to receive and to delay an output of the AND gate; and
   a NAND gate configured to receive an output of the delay unit and the measurement stop signal and to generate the control clock signal.

21. The semiconductor memory device of claim 17, wherein, when first through $n^{th}$ delayed signals are to be generated, the delayed signal generation unit comprises:
   first through $n^{th}$ flip-flops connected in series, and configured to receive the divided clock signal in response to the control clock signal; and
   first through $n-1^{th}$ NAND gates respectively configured to generate first through $n-1^{th}$ delayed signals,
   wherein a $k^{th}$ NAND gate is configured to generate a $k^{th}$ delayed signal, in response to one of an output signal and an inversion output signal of a $k^{th}$ flip-flop and an inversion signal of an output signal of a $k+1^{th}$ NAND gate,
   an $n-1^{th}$ NAND gate is configured to generate the $n-1^{th}$ delayed signal, in response to one of a output signal and an inversion output signal of an $n-1^{th}$ flip-flop and an output signal of the $n^{th}$ flip-flop,
   the $n^{th}$ delayed signal is an inversion signal of the output signal of the $n^{th}$ flip-flop, and
   the inversion output signal of the $n^{th}$ flip-flop is the measurement stop signal,
   where n is an integer and k is an integer equal to or greater than 1 and less than or equal to $n-2$.

22. The semiconductor memory device of claim 1, wherein the delay locked loop comprises:
   a phase detector configured to compare phases of the first internal clock signal with the fourth internal clock signal and to output a comparison signal;
   a delay controller configured to generate a phase control signal in response to the comparison signal;
   a first delay unit configured to delay the second internal clock signal and to generate the third internal clock signal in response to the phase control signal;
   a data output buffer replica unit configured to receive the third internal clock signal and to delay it for a delay time of the data output buffer; and
   a clock buffer replica unit configured to delay an output of the data output buffer replica unit for a delay time of the clock buffer and to output the fourth internal clock signal.

23. The semiconductor memory device of claim 1, wherein the second delay unit comprises:
   a logic circuit unit configured to generate a plurality of switch signals from a combination of the delayed signals and latency information of the memory device;
   a plurality of flip-flops connected in series, where the external command signal is sequentially input to the flip-flops in response to the external clock signal; and
   a switch unit configured to select a signal from among the external command signal and the output signals of the flip-flops and transmitting the selected signal as the second command signal, in response to the switch signals.

* * * * *